(12) United States Patent
Delsing et al.

(10) Patent No.: US 7,351,356 B2
(45) Date of Patent: Apr. 1, 2008

(54) LUMINESCENT MATERIAL, ESPECIALLY FOR LED APPLICATION

(75) Inventors: Anne Charlotte Antoinette Delsing, Eindhoven (NL); Hubertus T. Hintzen, Eindhoven (NL); Yuan-Qiang Li, Eindhoven (NL)

(73) Assignee: Osram Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 10/496,707

(22) PCT Filed: Sep. 23, 2003

(86) PCT No.: PCT/EP03/10599

§ 371 (c)(1),
(2), (4) Date: Mar. 24, 2005

(87) PCT Pub. No.: WO2004/030109

PCT Pub. Date: Apr. 8, 2004

(65) Prior Publication Data

US 2005/0205845 A1  Sep. 22, 2005

(30) Foreign Application Priority Data

Sep. 24, 2002  (EP) .................................. 02021172

(51) Int. Cl.
*C09K 11/59* (2006.01)
*H01L 51/50* (2006.01)

(52) U.S. Cl. ................. 252/301.4 S; 428/690; 428/917; 313/112; 313/503; 313/512; 257/98; 257/99; 257/102

(58) Field of Classification Search ................ 428/690, 428/917; 252/500, 301.4 F, 301.6 F; 313/503, 313/506, 485, 486, 212, 112, 512; 257/98, 257/99, 102
See application file for complete search history.

(56) References Cited

U.S. PATENT DOCUMENTS

| | | | |
|---|---|---|---|
| 6,255,670 B1 | 7/2001 | Srivastava et al. | |
| 6,278,135 B1 | 8/2001 | Srivastava et al. | |
| 6,649,946 B2 | 11/2003 | Bogner et al. | |
| 6,670,748 B2 * | 12/2003 | Ellens et al. | 313/503 |
| 6,682,663 B2 * | 1/2004 | Botty et al. | 252/301.4 R |
| 6,717,353 B1 * | 4/2004 | Mueller et al. | 313/501 |
| 7,061,024 B2 * | 6/2006 | Schmidt et al. | 257/98 |
| 2002/0043926 A1 * | 4/2002 | Takahashi et al. | 313/503 |
| 2006/0011922 A1 * | 1/2006 | Schmidt et al. | 257/76 |

FOREIGN PATENT DOCUMENTS

EP  1 104 799 A  6/2001
EP  1 193 306 A  4/2002

OTHER PUBLICATIONS

Van Krevel, "On new rare-earth doped M-Si-Al-O-N materials", TU Eindhoven 2000, ISBN 90-386-2711-4, Chapter 6 (pp. 73-87).

* cited by examiner

*Primary Examiner*—Dawn Garrett
*Assistant Examiner*—Camie S. Thompson
(74) *Attorney, Agent, or Firm*—Cohen Pontani Lieberman & Pavane LLP

(57) ABSTRACT

UV-blue excitable green luminescent material including an Eu-doped oxynitride host lattice with general composition $MSi_2O_2N_2$, wherein M is at least one of an alkaline earth metal chosen from the group Ca, Sr, Ba.

16 Claims, 3 Drawing Sheets

LUMINESCENT MATERIAL, ESPECIALLY FOR LED APPLICATION

RELATED APPLICATIONS

This is a U.S. national stage of International Application No. PCT/EP03/010599 filed on 23 Sep. 2003.

This patent application claims priority of European Application No. 02021172.7 filed 24 Sep. 2002, the disclosure of which is hereby incorporated by reference.

TECHNICAL FIELD

This invention relates to a luminescent material which is excitable in the UV-blue part of the spectral region, and more particularly, but not exclusively to a phosphor for light sources, especially for Light Emitting Diodes (LED). The phosphor belongs to the class of rare-earth activated silicon oxynitrides.

BACKGROUND ART

So far white LEDs were realized by combining a blue-emitting diode with a yellow emitting phosphor. Such a combination has a poor color rendition, which, however, can be improved significantly by using a red-green-blue system (RGB). Such a system uses for example a red and blue emitter in combination with a green-emitting aluminate phosphor, like $SrAl_2O_4$:Eu or $BaAl_2O_4$:Eu, with the possible addition of Mn to Eu, whose emission maximum is around 520 nm, see U.S. Pat. No. 6,278,135. However, the position of the excitation and emission bands of theses aluminates is not optimum. They have to be excited by short UV in the range of 330 to 400 nm.

On the other hand, some phosphors derived from the class of MSiON are known; see e.g. "On new rare-earth doped M—Si—Al—O—N materials" by van Krevel, TU Eindhoven 2000, ISBN 90-386-2711-4, Chapter 6. They are doped with Tb. Emission is achieved upon excitation by 365 nm or 254 nm.

DISCLOSURE OF THE INVENTION

It is an object of the present invention to provide a new luminescent material. A further object is to provide a phosphor with a fine-tuned green emission which can be efficiently excited by UV/blue radiation. A further object is to provide a phosphor for use in an illumination device with at least one LED as light source, the LED emitting primary radiation in the range from 380 to 470 nm, this radiation being partially or completely converted into longer-wavelength radiation by such phosphors which are exposed to the primary radiation of the LED. A further object is to provide an illumination device which emits white light and in particular has a high color rendering. A further object is to provide a high-efficiency illumination device like a LED device which absorbs well in the range from 380 to 470 nm and is easy to produce.

These and other objects are attained in accordance with one aspect of the invention directed to a luminescent material, a phosphor for LED-applications, which is excitable in the UV-blue region from 380 to 470 nm. The luminescent material includes an Eu-doped host lattice with general composition $MSi_2O_2N_2$, wherein M is at least one of an alkaline earth metal chosen from the group Ca, Sr, Ba and with a proportion of Eu from 0,1 to 30% of M.

The conversion is achieved at least with the aid of a phosphor which originates from the class of the Eu- or Eu,Mn-coactivated silicone oxynitrides. In more detail, a novel phosphor material is created by doping $MSi_2O_2N_2$ (M=Ca, Sr, Ba) host lattices with Eu ions. The obtained phosphors show high chemical and thermal stability.

More extended fine tuning of all relevant properties can be obtained by partial replacement up to 40%, the certain percent proportion given as x, of group (SiN) by (AlO), resulting in a general composition given by $MSi_{2-x}Al_xO_{2+x}N_{2-x}$. the preferred range is 1 to 15% (x=0,01 to 0,15).

Preferably, the metal M is Ca or at least mainly Ca with minor additions of Ba and/or Sr for a green-emitting material which can be efficiently excited with blue radiation. The incorporation of nitrogen increases the degree of covalent bonding and ligand-field splitting. As a consequence this leads to a shift of excitation and emission bands to longer wavelengths compared to oxide lattices. The obtained phosphors show high chemical and thermal stability.

More extended fine tuning of all relevant properties can be obtained by use of a cation M which is achieved by combining several of said M metals, by inclusion of Zn as part of cation M, preferably up to 5-40 mol-% of M, and/or at least partial replacement of Si by Ge. The amount of Eu doped to cation M is a partial replacement of between 0,1 and 25%, preferably between 2 and 15% of M. In addition, under the assumption of a given amount of Eu, further doping with Mn for fine-tuning of relevant properties is possible with an preferred amount of at most 50% of the given Eu doping.

Since these materials can convert UV-blue radiation into green light due to low-energy excitation bands, they can be applied for example in white light sources (e.g. lamps), especially based on primarily blue-emitting LEDs (typically based on GaN or InGaN with emission around 430 to 470 nm) combined with a red-emitting phosphor. A suitable red-emitting phosphor is a Eu-doped silicon nitride material, like $M_2Si_5N_8$ (M=Ca, Sr, Ba), see for example U.S. Pat. No. 6,649,946. Also application for colored light sources is possible.

BRIEF DESCRIPTION OF THE DRAWINGS

In the text which follows, the invention is explained in more detail with reference to a plurality of exemplary embodiments. In the drawings.

BEST MODE FOR CARRYING OUT THE INVENTION

Figure 1A:
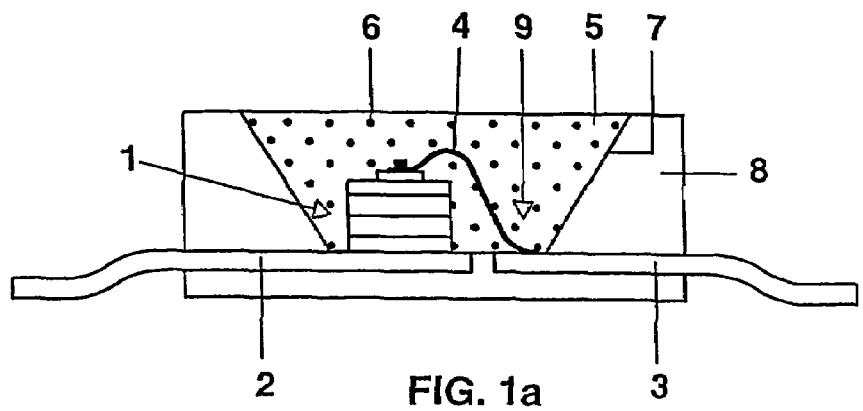
FIG. 1a shows a semiconductor component (LED) which serves as a light source for white light, with coating resin.

By way of example, a structure similar to that used in WO 01/40403 is described for use in a white LED together with an InGaN chip. The structure of such a light source for white light is specifically shown in FIG. 1a. The light source is based on a semiconductor component (chip 1) of type InGaN with a peak emission wavelength of 400 nm, having a first and a second electrical connection 2,3, which is embedded in an opaque base housing 8 in the region of a recess 9. One of the connections 3 is connected to the chip 1 via a bonding wire 4. The recess has a wall 7 which serves as reflector for the blue primary radiation of the chip 1. The recess 9 is filled with a potting compound 5 which contains a silicone casting resin (or epoxy casting resin) as its main constituents (pref. at least 80% by weight) and further comprises phosphor pigments 6 (pref. less than 15% by weight). There are also further small amounts of, inter alia, methyl ether and Aerosil. The phosphor pigments are a mixture of three pigments which emit blue, green and red light with the green phosphor being in accordance with the invention.

Figure 1B:
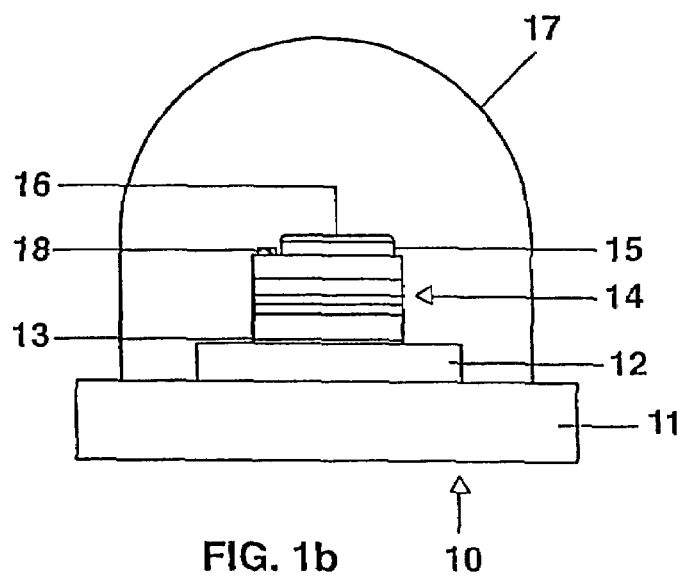
FIG. 1b shows an LED without coating resin.

FIG. 1b shows an embodiment of a light source with a semiconductor component 10 in which the conversion into white light is effected by means of phosphor conversion layers 16 which are applied directly to the individual chip. On top of a substrate 11 there are a contact layer 12, a mirror 13, a LED chip 14, a filter 15 and a phosphor layer 16, which is excited by the primary radiation of the LED, and converts it into visible long-wave radiation. This structural unit is surrounded by a plastic lens 17. Only the upper contact 18 of the two ohmic contacts is illustrated. Primary UV radiation of the LED is around 400 nm and secondary radiation is emitted by a first phosphor in accordance with the invention using $BaSi_2O_2N_2$:Eu emitting around 500 nm and by a second phosphor using a Nitridosilicate emitting orange-red.

Figure 2:
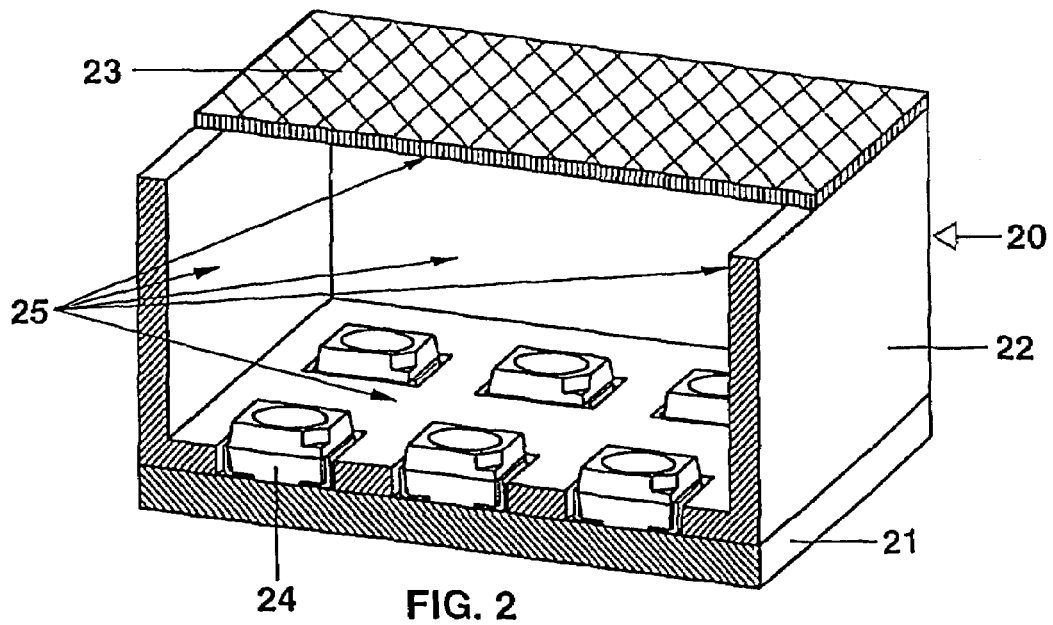
FIG. 2 shows an illumination device with phosphors in accordance with the present invention.

FIG. 2 shows an illumination device 20. It comprises a common support 21, to which a cubical outer housing 22 is adhesively bonded. Its upper side is provided with a common cover 23. The cubical housing has cutouts in which individual semiconductor components 24 are accommodated. They are blue emitting light-emitting diodes with a peak emission of around 450 to 470 nm. The conversion into white light takes place by means of conversion layers 25 which are arranged on all the surfaces which are accessible to the blue radiation. These include the inner surfaces of the side walls of the housing, of the cover and of the support. The conversion layers 25 consist of phosphors which emit in the red spectral region, and in the green spectral region using a phosphor according to the invention and mixing up together with the non-absorbed part of the primary radiation blue primary into white light.

$Eu_2O_3$ (with purity 99.99%), $BaCO_3$ (with purity>99.0%), $SrCO_3$ (with purity>99.0%), $CaCO_3$ (with purity>99.0%), $SiO_2$ and $Si_3N_4$ were used as commercially available raw materials for the production of the new inventive phosphors. The raw materials were homogeneously wet-mixed in the appropriate amounts by a planetary ball mill for 4-5 hours in isopropanol. After mixing the mixture was dried in a stove and ground in an agate mortar. Subsequently, the powders were fired in molybdenum crucibles at 1100-1400° C. under a reducing nitrogen/hydrogen atmosphere in a horizontal tube furnace. After firing, the materials were characterized by powder X-ray diffraction (copper K-alpha line).

All samples show efficient luminescence under UV-blue excitation with emission maxima in the blue-green (in case of M=Ba), green (M=Ca) or yellow-green (M=Sr). Typical examples of emission and excitation spectra can be seen in FIG. 3 (M=Ca), FIG. 4 (M=Sr) and FIG. 5 (M=Ba). For $CaSi_2O_2N_2$:Eu a green-emitting phosphor (560 nm peakemission) is obtained, which can be efficiently excited in the blue part of the spectrum (excitation maximum at about 440 nm). By using a mixed compound with M=(Ba,Sr) and varying the proportion of Ba and Sr, the emission can be shifted in the range 500-570 nm, while the top of the excitation band can be shifted from 400 nm up to 430 nm. The observed shift to higher wavelengths is ascribed to a center of gravity of the Eu $5d$ band at lower energy and a stronger ligand-field splitting of the Eu $5d$ band. Additional manipulation can be achieved by at least partial replacement (for example up to 15 mol-%) of (SiN) by (AlO), resulting in a preferred structure $MSi_{2-x}O_{2+x}Al_xN_{2-x}$:Eu (e.g. x=0, 15).

Since these materials can convert UV-blue radiation into green light due to low-energy excitation bands, they can be applied in white light sources, for example based on primarily blue-emitting LEDs (typically GaN or InGaN) combined with a red-emitting phosphor.

Additional fine tuning can be achieved by incorporation of Zn as an addition to cation M, preferably not more than 30%, and at least partial replacement of Si by Ge, preferably not more than 25%.

TABLE 1

| Raw materials | Grade |
| --- | --- |
| $MCO_3$ (M = Ca, Sr, Ba) | 99.0% |
| $SiO_2$ | Aerosil OX50 |
| $\gamma$-$Al_2O_3$ | >99.995 |
| $Si_3N_4$ | β content: 23.3%, O~0.7% |
| $Eu_2O_3$ | 99.99% |

In the following the synthesis procedures are given. Possible starting materials are shown in table 1.

All the oxynitride phosphors can be synthesized according to the following reaction equation:

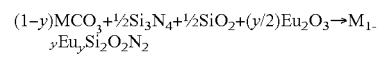

with (M=Ca, Sr, Ba). For example y=0,1.

The powder mixture is fired for several hours in Mo crucibles at 1100-1400° C. in a reducing atmosphere of mainly $N_2$ with small amounts of $H_2$ (10%) in horizontal tube furnaces.

With the atomic radius decreasing from Ba to Ca it was found that the replacement of $(SiN)^+$ by $(AlO)^+$ by this reaction became easier.

Figure 3:
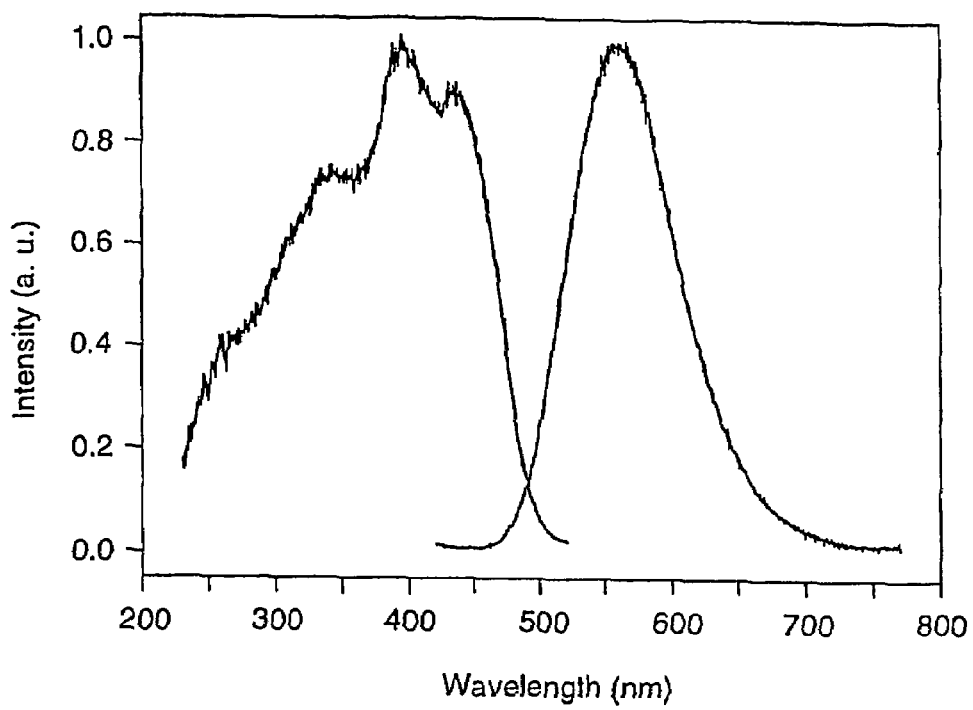
FIG. 3 to 5 show the emission spectra and reflection spectra of phosphors in accordance with the present invention.

FIG. 3 shows a typical emission/excitation spectra of $CaSi_2O_2N_2$:Eu.

Figure 4:
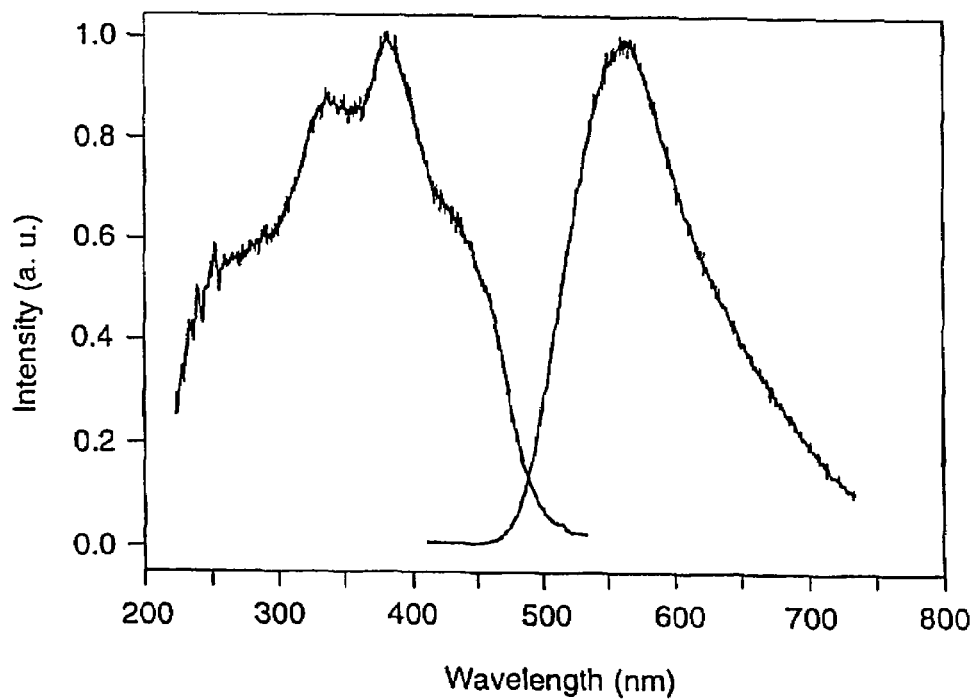

FIG. 4 shows a typical emission/excitation spectra of $SrSi_2O_2N_2$:Eu.

Figure 5:
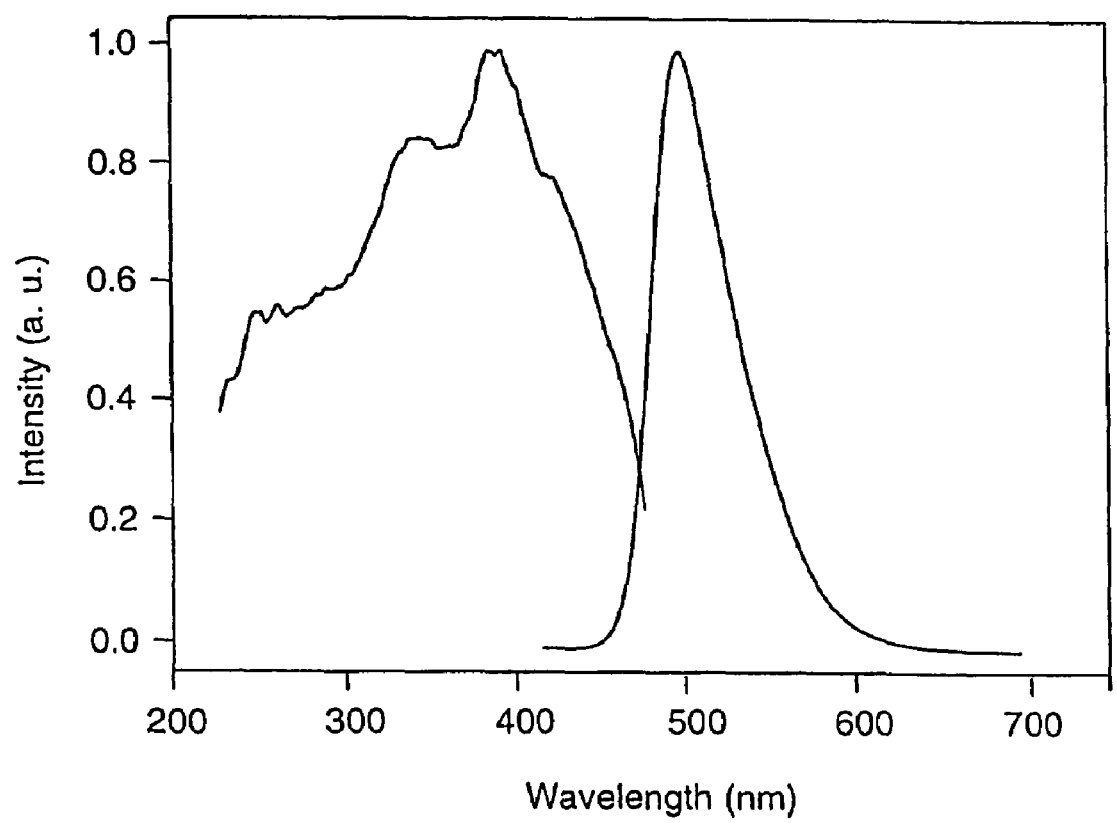

FIG. 5 shows a typical emission/excitation spectra of $BaSi_2O_2N_2$:Eu.

Doping with Eu was 10% of cation M in all embodiments.

The peak emission for M=Ca was around 560 nm, and for M=Sr it was around 570 nm, and for M=Ba it was around 500 nm.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

What is claimed is:

1. A luminescent material, a phosphor for LED-applications, which is excitable in the UV-blue region from 380 to 470 nm, characterized by a Eu-doped host lattice with general composition $MSi_2O_2N_2$, wherein M is at least one of an alkaline earth metal chosen from the group Ca, Sr, Ba and with a proportion of Eu from 0.1 to 30 mol % of M.

2. The UV-blue excitable luminescent material according to claim 1, wherein M is calcium in order to achieve green emission.

3. The UV-blue excitable luminescent material according to claim 1, wherein M is a mixture of at least two of these metals.

4. The UV-blue excitable luminescent material according to claim 1, wherein M comprises in addition Zn.

5. The UV-blue excitable luminescent material according to claim 1, wherein the host material is further doped with Mn.

6. A light source with a UV-blue excitable luminescent material according to claim 1.

7. A light source with a UV-blue excitable luminescent material according to claim 1, wherein the primary emitted light is blue and the UV-blue excitable luminescent material is combined with at least one other phosphor, in order to convert part of the primary emitted light into secondary emitted light of longer wavelength resulting in emitting white light.

8. A light source with a UV-blue excitable luminescent material according to claim 1, wherein the primary emitted radiation is UV and the UV-blue excitable luminescent material is combined with at least one other phosphor, in order to convert part of the primary emitted radiation into secondary emitted light of longer wavelength resulting in emitting white light.

9. The light source according to claim 6, wherein the light source is an illuminating device with at least one LED.

10. The light source according to claim 7, wherein the other phosphor is a red emitting phosphor.

11. The light source according to claim 8, wherein the other phosphor is a red emitting phosphor.

12. The UV-blue excitable luminescent material according to claim 4, wherein M comprises in addition Zn in a amount of no greater than 40 mol % but greater than 0 mol %.

13. The UV-blue excitable luminescent material according to claim 5, wherein the-amount of Mn is greater than 0 mol % but no greater than 50 mol% of the Eu doping.

14. A luminescent material, a phosphor for LED-applications, which is excitable in the UV-blue region from 380 to 470 nm, characterized by a Eu-doped host lattice with general composition $M(Si_{1-x'}+Ge_{x'})_2O_2N_2$, wherein M is at least one of an alkaline earth metal chosen from the group Ca, Sr, Ba and with a proportion of Eu from 0.1 to 30 mol % of M, and x' is greater than 0 but no greater than 1.

15. The luminescent material of claim 14 wherein x' is no greater than 0.25.

16. A luminescent material, a phosphor for LED-applications, which is excitable in the UV-blue region from 380 to 470 nm, characterized by a Eu-doped host lattice with general composition $MSi_{2-x''}Al_{x''}O_{2+x''}N_{2-x''}$, wherein M is at least one of an alkaline earth metal chosen from the group Ca, Sr, Ba and with a proportion of Eu from 0.1 to 30 mol % of M, and x'' is greater than 0 but no greater than 0.4.

* * * * *